(12) United States Patent
Behera

(10) Patent No.: US 7,139,204 B1
(45) Date of Patent: Nov. 21, 2006

(54) METHOD AND SYSTEM FOR TESTING A DUAL-PORT MEMORY AT SPEED IN A STRESSED ENVIRONMENT

(75) Inventor: Niranjan Behera, Newark, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 11/146,829

(22) Filed: Jun. 6, 2005

Related U.S. Application Data

(60) Provisional application No. 60/577,897, filed on Jun. 7, 2004.

(51) Int. Cl.
*G11C 29/00* (2006.01)

(52) U.S. Cl. .......................... 365/201; 365/49

(58) Field of Classification Search ............... 365/201, 365/49; 714/719
See application file for complete search history.

(56) References Cited

U.S. PATENT DOCUMENTS

| | | | |
|---|---|---|---|
| 5,579,322 A | 11/1996 | Onodera | |
| 6,084,820 A | 7/2000 | Raszka | |
| 6,269,036 B1 | 7/2001 | Shubat | |
| 6,333,872 B1 * | 12/2001 | Ouellette et al. | 365/189.06 |
| 6,496,432 B1 * | 12/2002 | Ouellette et al. | 365/201 |
| 6,519,202 B1 | 2/2003 | Shubat et al. | |
| 6,992,938 B1 | 1/2006 | Shubat et al. | |
| 7,031,866 B1 | 4/2006 | Behera et al. | |

* cited by examiner

*Primary Examiner*—Vu A. Le
(74) *Attorney, Agent, or Firm*—Blakely, Sokoloff, Taylor & Zafman LLP

(57) ABSTRACT

A method and system for testing a multi-port memory cell are described. According to one embodiment of the invention, a multi-port memory device comprises an array of multi-port memory cells. Accordingly, each multi-port memory cell is connected to one word-line and two bit-lines per read/write port. The memory device includes memory testing logic to perform a first memory access operation (e.g., read/write) at a first port of the multi-port memory cell while the memory cell is in a stressed condition. For example, the first memory access operation occurs while a second memory access operation is emulated on a second port. Moreover, the memory access operations occur at a frequency that is substantially equivalent to a maximum operating frequency of the dual-port memory device.

25 Claims, 6 Drawing Sheets

METHOD AND SYSTEM FOR TESTING A DUAL-PORT MEMORY AT SPEED IN A STRESSED ENVIRONMENT

RELATED APPLICATIONS

The present application is related to and claims the benefit of the filing date of U.S. Provisional Patent Application with Ser. No. 60/577,897, filed on Jun. 7, 2004, which is hereby incorporated herein by reference.

TECHNICAL FIELD

The present invention relates generally to the testing of solid-state memory devices. More particularly, the present invention relates to an improved method and system for testing dual-port memory cells at speed in a stressed condition.

BACKGROUND

As fabrication methods have improved and smaller geometry technologies, such as 90-nanometer design, have been developed, the area of silicon required to produce a memory device having a given data storage capacity has continued to decrease. Generally, these technological advances have led to a greater number of memory devices per silicon wafer, and consequently, a lower cost per memory device. Meanwhile, the overall storage capacity of memory devices has been continuously increasing. Unfortunately, this trend has resulted in significantly increasing the complexity involved in the testing of some memory devices. In particular, it has become increasingly challenging to rapidly and cost-effectively identify manufacturing defects in volatile memory devices, such as CMOS SRAM devices (i.e., complimentary metal oxide semiconductor, static random access memory devices).

One type of CMOS SRAM device that is particularly challenging to accurately and effectively test is a multi-port memory device having an array of multi-port memory cells. FIG. 1 illustrates a typical (prior art) multi-port memory cell 10 that is commonly used in multi-port memory devices. Similar to a single-port memory cell, the multi-port memory cell 10 shown in FIG. 1 includes a storage element comprised of two N-channel field effect transistors (FETs) (e.g., T1 and T2) interconnected with two cross-coupled P-channel transistors (e.g., T3 and T4). However, in contrast to a single-port memory cell, the multi-port memory cell 10 is connected to two word-lines and two pairs of bit-lines—one word-line and one pair of bit-lines per read/write port. Accordingly, the storage element of the multi-port memory cell can be independently and simultaneously accessed from each port during a single clock cycle.

Because the storage element of the multi-port memory cell is connected to multiple ports, a multi-port memory cell may be subject to certain states and stress conditions that are difficult to emulate in a testing mode. For example, one particular stress condition that a multi-port memory cell may encounter during normal operation is when both word-lines (e.g., WORD-LINE A and WORD-LINE B in FIG. 1) are asserted, or enabled, at the same time. This may occur, for example, when WORD-LINE A is asserted during a write cycle in which data is being written to the memory cell via PORT A, while WORD-LINE B is being asserted in connection with a read operation to read data from the memory cell via PORT B. It is during these stress conditions that the memory cell is most likely to fail, if the memory cell or the circuit of which the memory cell is a part, has a manufacturing defect.

Traditional testing logic generally tests each memory cell by simply performing a write operation to write a logical data value to the memory cell, followed by a read operation. If the logical data value read from the memory cell matches the logical data value written, then the memory cell, and the circuit of which the memory cell is a part, are assumed not to be defective. During both the read and write operation, the port that is not in use is disabled. For example, the word-line associated with the port that is not in use is kept at a low voltage state, thereby isolating the bit-lines connected to that particular word-line from the data storage element. Consequently, traditional approaches to testing multi-port memory devices fail to test the memory cells in the stressed conditions that the memory cells may encounter during normal operation.

Another problem with traditional multi-port memory testing methods is that often the testing logic used to test the individual memory cells of the array does not operate at the clock frequency at which the device will operate under normal conditions. For example, one common technique used for memory testing is to implement testing logic, sometimes referred to as built-in self-test and repair (BISTR) logic that is physically remote from the memory core (e.g., the array of dual port memory cells). The BISTR logic may generate control and testing signals including data and address signals for testing one or more memory devices. If multiple memory devices are connected to the BISTR, the control and test signals may be heavily loaded, thereby affecting the maximum frequency at which the memory device can be clocked. Moreover, because the BISTR logic is often implemented to be physically separated from the memory core, the testing and control signals may experience a propagation delay in reaching the memory core. Furthermore, it may take more than one clock cycle to generate and set-up the control and testing signals. Consequently, errors that may occur when the memory device is operated at its normal operating frequency may not be detected if the memory device is tested at a frequency other than the normal operating frequency.

SUMMARY OF THE DESCRIPTION

A method and system for testing a multi-port memory cell are described. According to one embodiment of the invention, a multi-port memory device comprises an array of multi-port memory cells. Accordingly, each multi-port memory cell is connected to one word-line and two bit-lines per read/write port. The memory device includes memory testing logic to perform a first memory access operation (e.g., read/write) at a first port of the multi-port memory cell while the memory cell is in a stressed condition. For example, the first memory access operation occurs while a second memory access operation is emulated on a second port. Moreover, the memory access operations occur at a frequency that is substantially equivalent to a maximum operating frequency of the dual-port memory device.

BRIEF DESCRIPTION OF THE DRAWINGS

The present invention is illustrated by way of example, and not by way of limitation, in the figures of the accompanying drawings, in which like references indicate similar elements, and in which.

DETAILED DESCRIPTION

Figure 1:
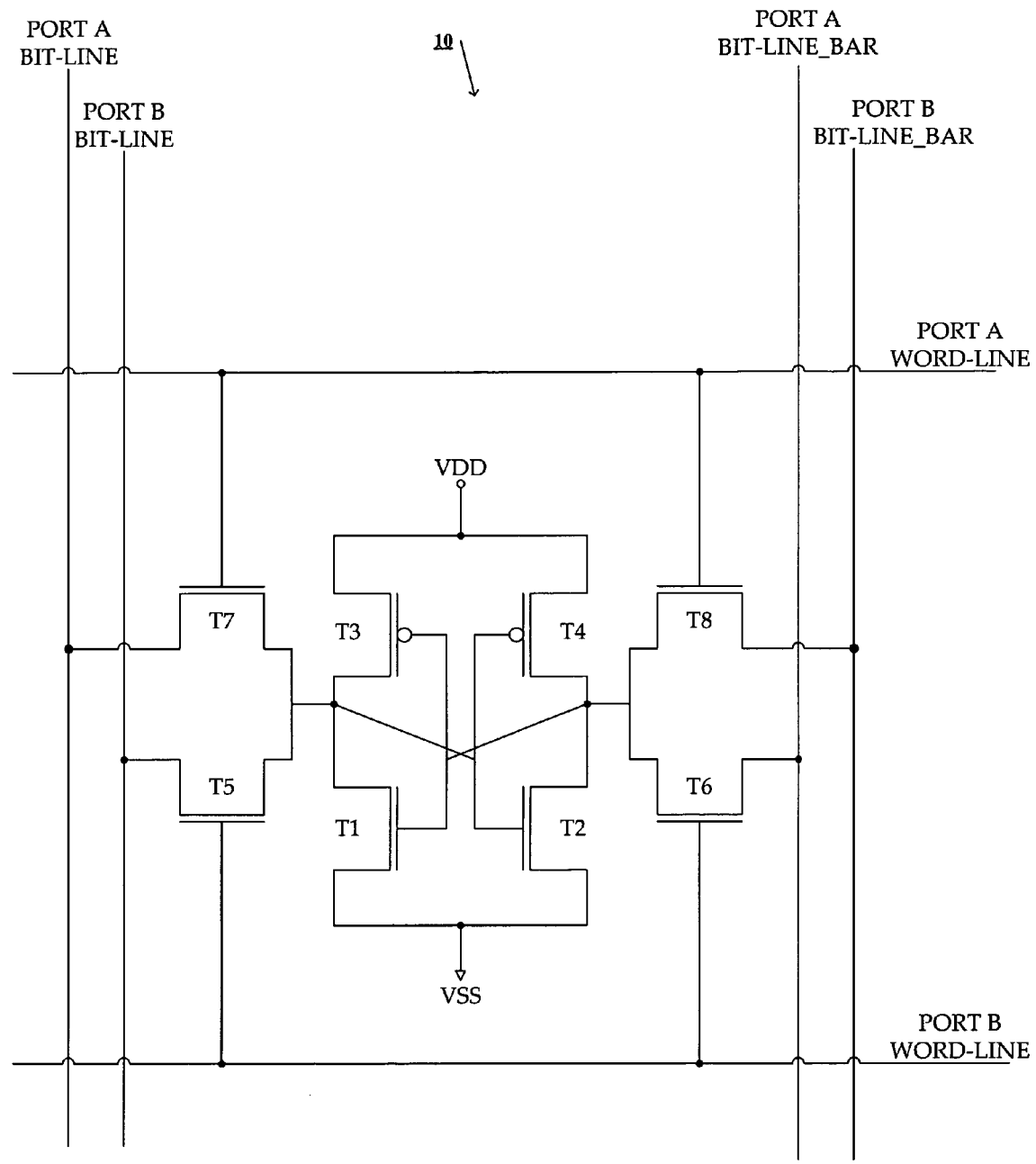
FIG. 1 illustrates a typical (prior art) multi-port memory cell that is commonly used in multi-port memory devices.

In general, a method and system for testing a multi-port memory device are described. In the following description, for purposes of explanation, numerous specific details are set forth in order to provide a thorough understanding of the present invention. It will be evident, however, to one skilled in the art that the present invention may be practiced without these specific details.

Consistent with one embodiment of the invention, a multi-port memory device includes memory testing logic that is local to the memory core and operates to test the individual multi-port memory cells of a multi-port memory cell array while the memory cells are in a stressed condition. Moreover, the individual multi-port memory cells of the memory cell array are tested at a clock frequency that is substantially equivalent to the maximum operating clock frequency of the memory device (e.g., at a frequency equivalent to the system clock). Consequently, defects in the memory cells, which may go unnoticed if tested under less strenuous conditions, may be identified when tested under stress at normal operating speed.

In one embodiment of the invention, the memory testing logic receives serially issued test commands from a remote built-in self-test (BIST) processor, and in response, the local memory testing logic generates a variety of test signals, including control, address and data signals, that cause the read/write logic of the memory device to perform various memory tests on individual multi-port memory cells in the memory cell array. In particular, the memory testing logic of one embodiment of the invention generates test signals that cause individual memory cells to be tested in a stressed condition by performing a memory access operation via one port of the memory cell, while a memory access operation is emulated on a second port. For example, in one embodiment of the invention, a read operation is performed on a first port (e.g., a read port) of the multi-port memory cell, while a write operation is emulated on a second port (e.g., a write port) of the multi-port memory cell. Similarly, a write operation may be performed on a first port (e.g., a write port) of the memory cell, while a read operation is emulated on a second port (e.g., a read port) of the memory cell. Accordingly, each memory cell of the memory device may be tested for manufacturing defects under operating conditions that are most likely to expose any such defects.

In one embodiment of the invention, emulating a memory access operation on a port is accomplished by asserting the word-line associated with that port. For example, to emulate a write operation on the write port during a read operation on the read port, the word-line associated with the write port is asserted, and at the same time, the write driver logic is disabled so as to prevent the memory cell from actually being written. Similarly, to emulate a read operation on a read port while a write operation is performed on a write port, the word-line associated with the read port is asserted and the sense amplifier is disabled to prevent actually reading a logical data value from the memory cell.

Figure 2:
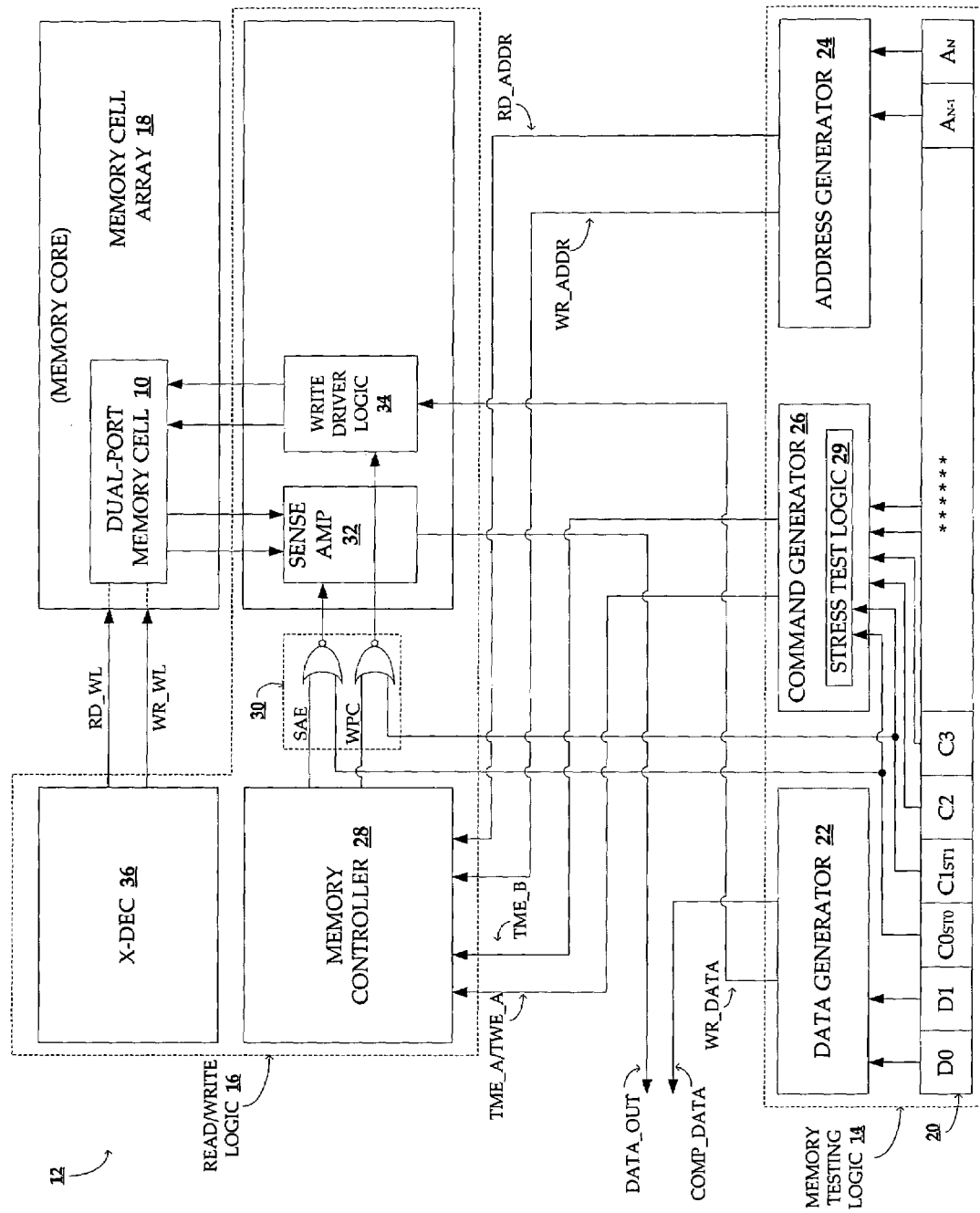
FIG. 2 illustrates a functional block diagram of a memory device including testing logic consistent with one embodiment of the invention.

FIG. 2 illustrates a functional block diagram of a memory device 12 including memory testing logic 14 consistent with one embodiment of the invention. As illustrated in FIG. 2, the primary components of the memory device 12 include read/write logic 16, an array of dual-port memory cells 18, and a memory testing logic 14. According to one embodiment of the invention, the memory testing logic 14 includes a command scan register 20, where it receives serially issued commands from a remote built-in self-test (BIST) processor (not shown). Based on the BIST command(s) received from the BIST processor, the memory testing logic 14 generates a variety of testing signals, such as test control signals, address signals and data signals utilized by the read/write logic to perform memory testing operations on the individual memory cells of the dual-port memory cell array. Because the various test control signals, address signals and data signals are generated by memory testing logic 14 that is local to the memory core 18, the memory device 12 can be tested at the frequency of the system clock, thereby exposing potential defects that may go unidentified if the memory device is tested at a frequency other than the frequency at which the memory device will operate under normal operating conditions.

As illustrated in FIG. 2, the command scan register 20 is divided into several segments or portions, including a data portion represented by D0 and D1 (D—for Data), a command portion represented by C0ST0, C1ST1, C2 and C3 (C—for command, and ST—for Stress Test), as well as an address portion represented by $A_{N-1}$ and $A_N$ (A—for Address). It will be appreciated that the actual number of data bits associated with any particular segment or portion of the BIST command will depend on the particular implementation. For example, the number of data bits associated with the address and data portions may be dependent upon the size of the memory cell array (e.g., the word size) in the memory device 12. Similarly, the number of data bits dedicated to the test command portion of the BIST command may be dependent upon the number and different types of memory tests that are implemented.

As illustrated in FIG. 2, the data bits associated with the data portion of the BIST command are routed to a data generator 22. The data generator 22 receives the data portion of the BIST command and generates a data signal (e.g. WR_DATA) during a memory testing operation that involves a memory write operation. For example, during a memory write operation, the data generator 22 will assert a particular logical data value or bit pattern via the signal WR_DATA. Accordingly, the logical data value associated with the signal WR_DATA will be written to the memory address generated by the address generator 24 if the memory test command generated by the command generator 26 indicates the memory test type involves a memory write operation. It will be appreciated by those skilled in the art that the signal WR_DATA, despite appearing in FIG. 2 as a single data line, may represent multiple data signals—one for each data bit in the data portion of the BIST command.

Depending on the particular type of memory test operation to be performed, the address generator 24 generates the appropriate memory address signal (e.g., WR_ADDR and/or RD_ADDR) during a memory testing operation involving a read and/or write operation. Accordingly, if the memory test command indicated by data bits C0ST0, C1ST1, C2 and C3 involves a read operation, the address generator will assert one or more address signals for reading and/or writing a particular memory location based on the particular memory test indicated by the command portion of the BIST command.

The command generator 26 receives the memory test command portion of the BIST command from the command scan register 20. Accordingly, based on the value of the data bits represented by C0ST0, C1ST1, C2 and C3 in the command scan register, the command generator 26 generates test control signals that are routed to and control the function of the read/write logic. In particular, the control signals TME_A/TWE_A and TME_B (TME—test memory enable, and TWE—test write enable) indicate to the memory controller 28 of the read/write logic when a particular port of a memory cell associated with the address is to be activated. For example, in one embodiment, when a port is to be activated, the word-line connected to that port is asserted. This allows the read/write logic 16 to generate a stress condition at a particular memory cell by emulating a read or write operation on one port, while a read or write operation is occurring on another port.

In one embodiment of the invention, the memory test command includes two data bits dedicated to commands involving stress testing. For example, as illustrated in FIG. 2, the data bits C0ST0 and C1ST1 are data bits indicating whether a stress condition should be generated during a memory testing operation, and if so, the type of stress condition (e.g., the particular port to be stressed). Accordingly, the signals associated with C0ST0 and C1ST1 are routed to the stress test logic 29 portion of the command generator 26, which decodes the command to generate the proper test control signals for controlling the read/write logic. In addition, it can be seen in FIG. 2 that the signals associated with C0ST0 and C1ST1 are also routed to the NOR gates 30 for controlling the function of the sense amplifier 32 and the write driver logic 34. Accordingly, when C0ST0 is asserted, the sense amplifier 32 will be disabled during a read operation. Similarly, when C1ST1 is asserted, the write driver logic 34 will be disabled during a write operation.

In one embodiment of the invention, the memory testing logic 14 is configured to perform back-to-back memory access operations for a single BIST command. For example, the command scan register 20 may receive a single BIST command that causes the data generator 22, command generator 24, and address generator 26 to generate data signals, test control signals and address signals to perform two memory access operations back-to-back. The two memory access operations may be directed to the same memory address, or to two different memory addresses. Furthermore, the two memory access operations may involve any combination of read operations and write operations, including back-to-back reads, back-to-back writes, a write followed by a read, or a read followed by a write.

In one embodiment of the invention, the BIST command may have six data bits associated with a memory test command. Accordingly, the following table (TABLE 1) sets forth the different memory test commands associated with one embodiment of the invention:

TABLE 1

| Test Command C0-C1-C2-C3-C4-C5 | Mode of Operation | Control Signals Generated | Comments |
| --- | --- | --- | --- |
| 000000 | Idle | None | Disabled |
| 010100 | Single Cycle Write (W) | TME_A/TWE_A high during first cycle | Only Port A is accessed, both word-lines are on (stress mode) |
| 100001 | Single Cycle Read (R) | TME_B high during first cycle | Only Port B is accessed, both word-lines are on (stress mode) |
| 000101 | Single Cycle Read and Write at Different Addresses (R/W) | TME_A/TWE_A and TME_B high during first cycle | Port A and Port B are accessed, but at different addresses; Different word-lines are active for each cycle |
| 011100 | Back-to-Back Cycle Write (W + W) | TME_A/TWE_A high during first and second cycles | Port A is accessed, both word-lines are active for two cycles (stress mode) |
| 000110 | Back-to-Back Cycle Write and Read (W + R) | TME_A/TWE_A high during first cycle; TME_B high during second cycle | Port A is accessed during first cycle (W), and Port B is accessed during the second cycle (R) |
| 001001 | Back-to-Back Read and Write (R + W) | TME_B high during first cycle; TME_A/TWE_A high during | Port B is accessed during the first cycle (R), and Port A is accessed |

TABLE 1-continued

| Test Command C0-C1-C2-C3-C4-C5 | Mode of Operation | Control Signals Generated | Comments |
|---|---|---|---|
| | | second cycle | during the second cycle (W) |
| 100011 | Back-to-Back Read (R + R) | TME_B high during first and second cycles | Port B is accessed during both the first and second cycle |

It will be appreciated by those skilled in the art that the memory test commands, and their association with their respective data bit values, are provided as one example. In various embodiments, subsets and supersets of the memory testing commands shown in Table 1 may be implemented without departing from the spirit of the present invention.

In one embodiment of the invention, the read/write logic 16 includes a memory controller 28, where it receives test control signals and address signals from the memory testing logic (e.g., TME_A/TWE_A, TME_B, WR_ADDR and RD_ADDR). In addition to the control and address signals associated with the testing logic, the memory controller 28 may receive address signals (not shown) from one or more additional sources, for example, for purposes other than testing. Based on the address signals received at the memory controller 28, the address decoder (e.g. X-DEC 36) decodes the address signal and asserts one or more word-lines (e.g., RD_WL and/or WR_WL) for the row corresponding to the particular memory location to be tested. Accordingly, during a memory testing operation that involves generating a stress condition, both word-lines for a particular memory row may be asserted.

Figure 3:
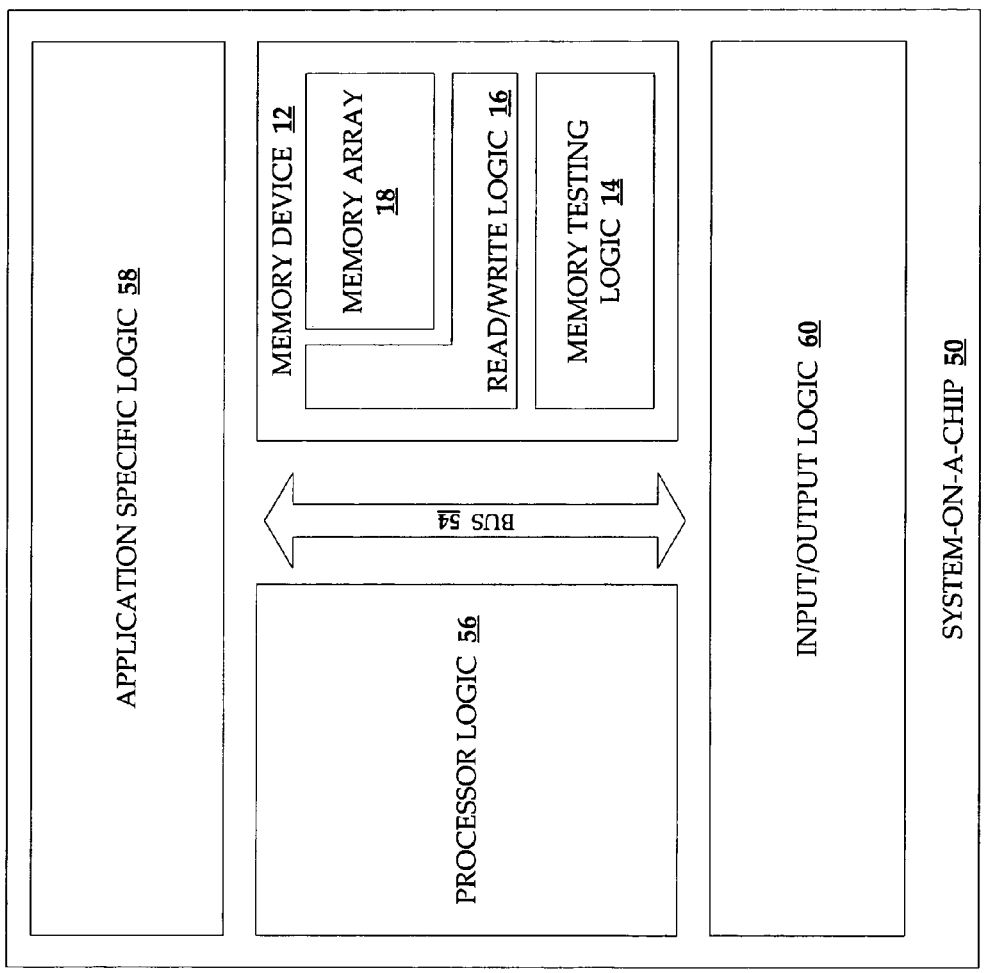
FIG. 3 illustrates a functional block diagram of a portion of an embodiment of a System-on-a-Chip (SoC) including a memory device with a built-in self-test (BIST) processor and memory testing logic for testing a memory cell array.

FIG. 3 illustrates a functional block diagram of a portion of an embodiment of a System-on-a-Chip (SoC) 50 including a memory device 12 with a built-in self-test (BIST) processor 52 and memory testing logic 14 for testing a memory cell array. The system-on-a-chip (SoC) 50 includes a memory device 12 with a remote BIST processor 52, and memory testing logic 14 local to the core of the memory device 12. The SoC 50 includes a bus 54 (e.g., data bus, and/or address bus) that interconnects the memory device 12 with processor logic 56, application specific logic 58, and input/output logic 60. In a typical SoC 50, a non-volatile memory device (not shown) stores boot-up instructions that are executed by the processor logic 56 when the system is powered on. Depending on the particular system and application, the processor logic 56 of the SoC 50 may execute software programs stored as a sequence of instructions in one or more memory devices. In addition, the application specific logic 58 may process data while the input/output logic 60 may send and receive data to various other components (not shown).

In one embodiment of the invention, the BIST processor 52 may be designed to serially issue commands to a command scan register that is part of the memory testing logic 14 local to the core of the memory device 12. Accordingly, the memory testing logic 14 decodes the BIST commands and generates the appropriate testing signals locally, for example, at the core of the memory device 12. Consequently, the locally generated signals cause the memory device 12 to be tested at a high frequency. Moreover, the memory testing commands include one or more commands that generate stress conditions by emulating an operation on one port of a memory cell, while a memory access operation is occurring at another port of the memory cell. By issuing commands serially from the BIST to the local memory testing logic 14, the entire memory device 12 can be tested for defects at speed and under a stress condition.

Figure 4:
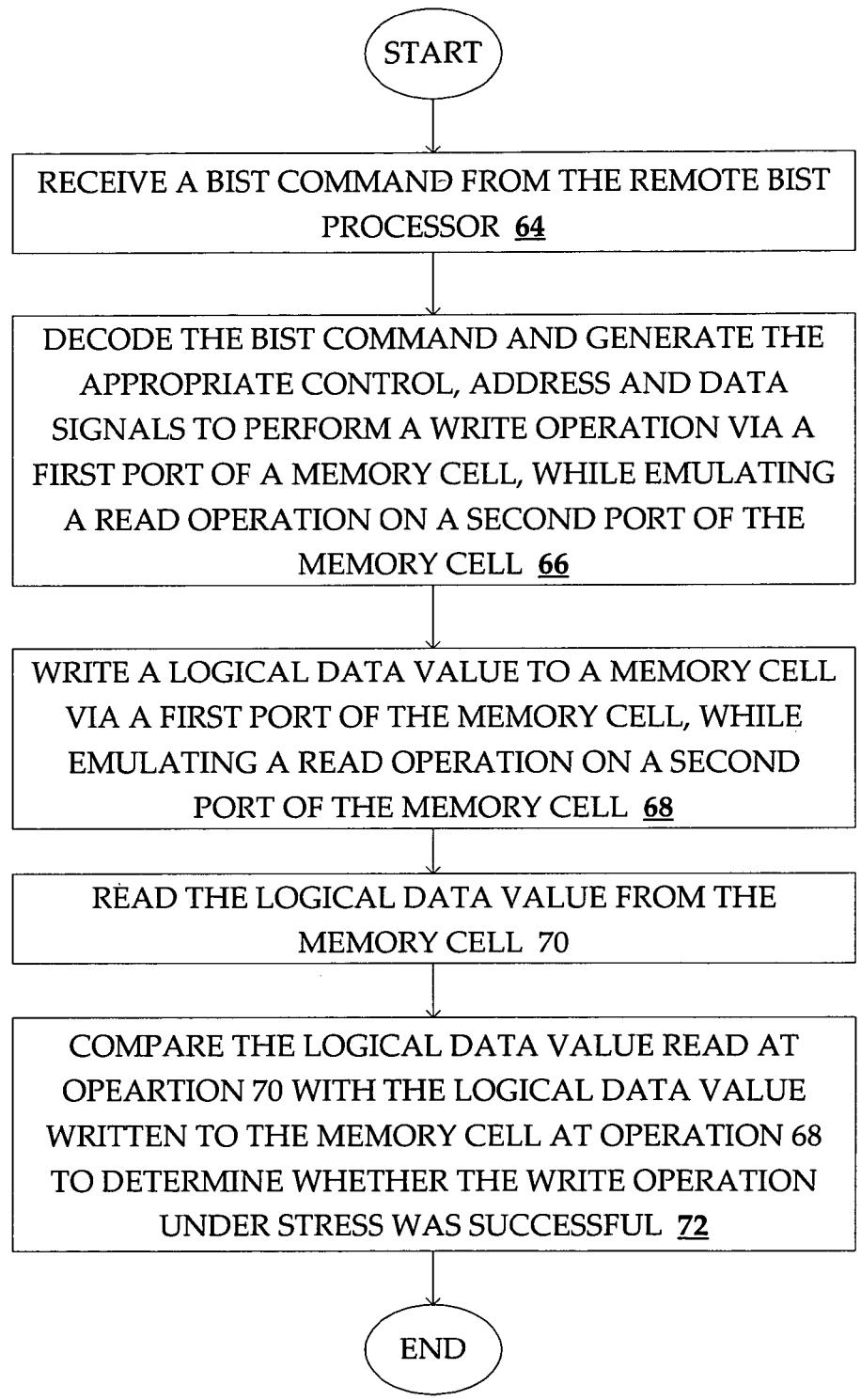
FIG. 4 illustrates a method for testing a dual-port memory cell, according to one embodiment of the invention, by performing a write operation on a first port of the memory cell, while a read operation is emulated on a second port of the memory cell.

FIG. 4 illustrates a method 62 for testing a dual-port memory cell, according to one embodiment of the invention, by performing a write operation on a first port of the memory cell, while a read operation is emulated on a second port of the memory cell. For example, a logical data value is written to the storage element of the memory cell while the memory cell is in a stressed condition. After the write operation, the logical data value is read back from the memory cell in a non-stressed condition, and then compared to the data value previously written to the memory cell. If the logical data value matches the expected logical data value, it is assumed that the memory write operation performed under the stress condition was successful.

The method 62 begins at operation 64 when a command is received from a built-in self-test (BIST) processor. The command includes various segments such as data, address and memory test command segments. Accordingly, at operation 66, each segment of the BIST command is decoded and the appropriate address, data and test control signals are generated.

In the case of a memory write operation under a stress condition, the test control signals will cause the word-lines for both the read port and the write port to be asserted at the same time. Accordingly, at operation 68, a memory write operation is performed at a first port of the memory cell while a read operation is emulated at a second port of the memory cell. For example, in one embodiment of the invention, a read operation is emulated when the test control signals cause the word-line of the read port to be asserted, and at the same time, a test control signal causes the sense amplifier to be disabled so as to prevent an actual read operation from occurring.

Next, at operation 70, the logical data value that was written to the memory cell at operation 68 is read back from the memory cell. For example, during the read operation associated with operation 70, the logical data value may be read from one port (e.g. the read port) while the other port (e.g., the write port) is inactive. In one embodiment, the read operation may be triggered by receiving a second BIST command from the remote BIST processor. However, in an alternative embodiment, a single BIST command may trigger both the write and the read operations. In any case, at operation 72, the logical data value read during operation 70 is compared to the known logical data value that was written to the memory cell during operation 68. In one embodiment of the invention, the data generator 22 of the memory testing logic 14 generates the known logical data value to be compared with the logical data value (e.g., the COMP_DATA signal in FIG. 2) read at operation 70. In any case, if the two data values are the same, it is assumed that the write operation 68 under a stress condition was successful. However, if the logical data values are not the same, then it is assumed that the write operation under the stress condition failed. Accordingly, further testing may be performed. In one embodiment, the BIST processor may have repair functions, which can repair the memory device by re-mapping one or more columns or rows of memory cells, as is well known in the art.

Figure 5:
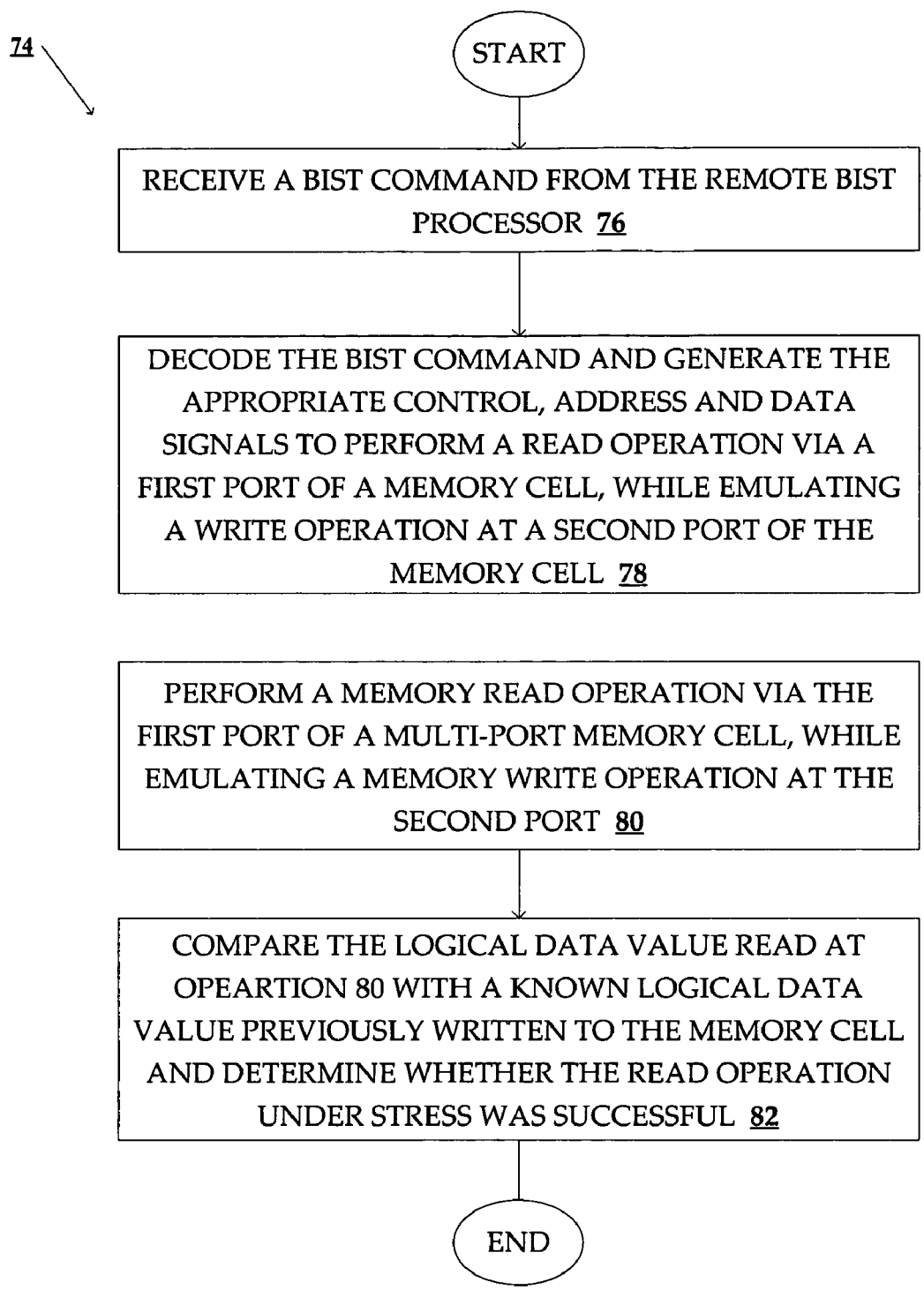
FIG. 5 illustrates a method for testing a dual-port memory cell, according to one embodiment of the invention, by performing a read operation on a first port of the memory cell, while a write operation is emulated on a second port of the memory cell.

FIG. 5 illustrates a method 74 for testing a dual-port memory cell, according to one embodiment of the invention, by performing a read operation on a first port of the memory cell, while a write operation is emulated on a second port of the memory cell. In this case, a logical data value is first written to the memory cell in a non-stressed condition. That is, the logical data value is written via a first port while the second port is inactive. Next, the logical data value of the memory cell is read back while in a stress condition. For example, the logical data value is read via a read operation on a first port while a write operation is emulated on a second port. If the logical data value read under stress is as expected, then the read operation under stress is assumed to have been successful.

The method 74 begins at operation 76 when a command is received from a built-in self-test (BIST) processor. At operation 78, each segment of the BIST command is decoded and the appropriate address, data and test control signals are generated. In this case, the memory test command indicates a read operation is to be performed under a stress condition. Accordingly, the test control signals will cause the word-lines for both the read port and the write port to be asserted at the same time for the row corresponding to the address being tested. At operation 80, a read operation is performed at a first port of the memory cell while a write operation is emulated at a second port of the memory cell. For example, in one embodiment of the invention, a write operation is emulated when the test control signals cause the word-line of the write port to be asserted, and at the same time, a control signal causes the write driver logic to be disabled so as to prevent a write operation from occurring.

Next, at operation 82, the logical data value read during the read operation is compared with a known logical data value previously written to the memory cell. If the two data values are the same, it is assumed that the read operation 80 under stressed conditions was successful. However, if the logical data values are not the same, then it is assumed that the read operation under stressed conditions failed. Accordingly, further testing may be performed.

In another method consistent with the present invention, a read operation under stress may be followed by a second read operation in a non-stressed condition. For example, it is possible that a read operation in a stressed condition may result in an accurate read of the logical data value stored in the memory cell, but at the same time cause the memory cell to flip, or change logical data values (e.g., from a logical one to a logical zero, or from a logical zero to a logical one). Accordingly, in one embodiment of the invention, the memory cell is tested by reading the memory cell in a stressed condition, and then following up the memory read with a second read operation in a non-stressed condition. If the read operations both result in the same logical data value, then it is assumed the read under stress did not cause the memory cell to flip its logical data value.

It will be appreciated by those skilled in the art that the above methods are merely provided as examples, and accordingly, they represent only two of the many memory tests that might be implemented without departing from the spirit of the present invention. For example, as briefly described above, in one embodiment of the invention, a single BIST command may generate back-to-back memory access operations.

Figure 6:
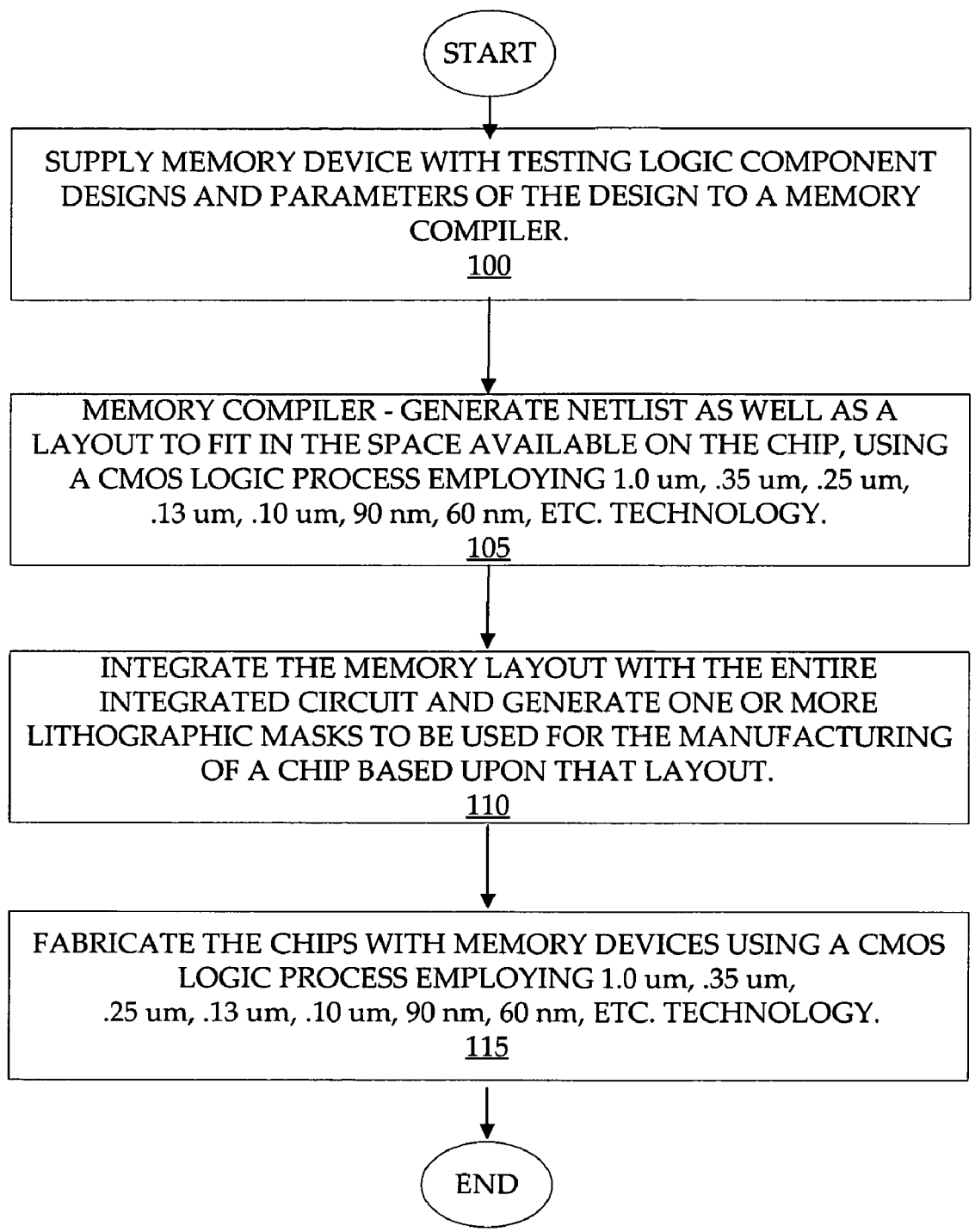
FIG. 6 illustrates an example of a process for generating an embedded memory, with stress testing capabilities, from designs of memory components utilizing a memory compiler consistent with one embodiment of the invention.

FIG. 6 illustrates an example of a process for generating an embedded memory, with stress testing capabilities, from designs of memory components utilizing a memory compiler consistent with one embodiment of the invention. In block 100, the designs for each memory component for the memory device and testing logic are supplied to the memory compiler, as well as other design parameters such as the number of columns and number of rows of the array, the available size on the chip and other parameters. Thus, the designs for a memory device with testing logic may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system integrated circuit (IC) integrators to rapidly create hundreds of silicon-proven memory cores. The memory compiler may receive the memory component designs and utilize those memory component designs in conjunction with memory circuit designs to optimize a circuit design and layout in the space available on a target chip.

In block 105, the memory compiler may generate a netlist and a layout targeted to fit in the space available on a target chip. Typically, the memory compiler will store the data representing the memory device on a machine-readable medium. The memory compiler may select the memory component building blocks so that they are sized appropriately for the targeted fabrication technology. The memory compiler then may provide the memory layout to be used to generate one or more lithographic masks utilized in the fabrication of the memory device with testing logic. The memory compiler may also provide a netlist for verification of the memory device.

In block 110, the generated memory layout may be integrated with the rest of the layout for the chip and a machine may generate the lithographic masks that contain the information necessary for the fabrication of a functional device. The machine may generate one or more lithographic masks for transferring the circuit design onto the chip.

In block 115, a fabrication facility may fabricate one or more chips with the memory devices utilizing the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 60 nm or less, to fabricate the chips. The size of the CMOS logic process employed typically defines the smallest minimum lithographic dimension that can be fabricated on the chip using the lithographic masks, which in turn, determines minimum component size. According to one embodiment, light may pass through these lithographic masks onto the chip to transfer the circuit design and layout for the memory onto the chip itself. In one embodiment, the memory design compiler is designed for embedded applications in a standard CMOS logic process.

In one embodiment, a memory compiler may be implemented in software as a set of instructions stored on a machine-readable medium. A machine-readable medium may include any mechanism that provides (e.g., stores and/or transmits) information in a form readable by a machine (e.g., a computer). For example, a machine-readable medium may include, but not be limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions. Instruction on a slower medium could be cached to a faster, more practical, medium.

In one embodiment, an example memory compiler may comprise the following: a graphic user interface, a common set of processing elements, and a library of files containing design elements such as circuits, control logic, and cell arrays that define the weak bit testing memory. In addition, one embodiment, a memory compiler may include object code in a set of executable software programs.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "reading" or "writing" or "calculating" or "determining" or "displaying" or the like, refer to the action and processes of a computer system, electronic circuit, or similar electronic computing device, that manipulates and transforms data represented as physical (electronic) quantities within the computer system's registers and memories into other data similarly represented as physical quantities within the computer system memories or registers, or other such information storage, transmission or display devices.

Thus, a method and system are provided with reference to specific exemplary embodiments. It will be evident that various modifications and changes may be made to these embodiments without departing from the broader spirit and scope of the invention. For example, the SoC 50 shown in FIG. 3 is presented as an example of the type of system in which the present invention may be integrated, but is not meant in any way to limit the present invention to such an implementation. It will be appreciated that the present invention may be implemented to work with a wide variety of integrated circuit devices, including stand-alone memory devices, ASICs and SoCs that vary from those presented herein. Accordingly, the specification and drawings are to be regarded in an illustrative rather than a restrictive sense.

I claim:

1. A dual-port memory device, comprising:
   an array of dual-port memory cells;
   read/write logic to read from and write to the array of dual-port memory cells; and
   memory testing logic to cause the read/write logic to perform a read operation at a first port of a first dual-port memory cell while the first dual-port memory cell is in a stressed condition, the read operation occurring at a frequency substantially equivalent to a maximum operating frequency of the dual-port memory device, and the stressed condition caused by emulating a write operation at a second port of the dual-port memory cell during the read operation, wherein the memory testing logic includes a command scan register to receive one or more serially issued commands from a built-in self-test processor, each command including a data portion, a memory address, and a memory test command.

2. The memory device of claim 1, further comprising:
   data comparison logic to compare a logical data value read during the read operation with a known logical data value previously written to the memory cell.

3. The memory device of claim 1, wherein the read/write logic is to emulate a write operation at a second port of the first dual-port memory cell during the read operation by asserting a word-line connected to the dual-port memory cell via the second port, and disabling write driver logic so as to prevent writing a logical data value to the first dual-port memory cell via the second port.

4. The memory device of claim 1, wherein, in performing the read operation, the read/write logic is to assert a word-line connected to the memory cell via the first port, and sense at a sense amplifier a voltage differential between a pair of bit-lines connecting the sense amplifier with the memory cell via the first port.

5. The memory device of claim 1, wherein the memory device further comprises:
   a data generator to generate data signals during a memory test involving a memory write operation, the data signals generated based on the data portion of a command received from the built-in self-test processor;
   an address generator to generate a second memory address during a memory test operation, the memory address generated based on the memory address included as part of the command received from the built-in self-test processor and corresponding to the location of the dual-port memory cell to be tested; and
   a memory test command generator to decode the memory test command included as part of the command received from the built-in self-test processor, and to generate control signals for performing the memory test operation.

6. A machine-readable medium storing data that represents the dual-port memory device of claim 1.

7. The machine-readable medium, storing a memory compiler to provide a design for one or more lithographic masks used in fabricating a dual-port memory device, comprising:
   an array of dual-port memory cells;
   read/write logic to read from and write to the array of dual-port memory cells;
   memory testing logic to cause the read/write logic to perform a read operation at a first port of a first dual-port memory cell while the first dual-port memory cell is in a stressed condition, the read operation occurring at a frequency substantially equivalent to a maximum operating frequency of the dual-port memory device, and the stressed condition caused by emulating a write operation at a second port of the first dual-port memory cell during the read operation.

8. A dual-port memory device, comprising:
   an array of dual-port memory cells;
   read/write logic to read from and write to the array of dual-port memory cells; and memory testing logic to cause the read/write logic to perform a write operation at a first port of a first dual-port memory cell while the first dual-port memory cell is in a stressed condition, the write operation occurring at a frequency substantially equivalent to a maximum operating frequency of the dual-port memory device, and the stressed condition caused by emulating a read operation at a second port of the dual-port memory cell during the write operation, wherein the read/write logic is to emulate a read operation at a second port of the first dual-port memory cell during the write operation by asserting a word-line connected to the memory cell via the second port, and disabling a sense amplifier so as to prevent reading a logical data value from bit-lines connected to the first dual-port memory cell via the second port.

9. The memory device of claim 8, further comprising:
data comparison logic to compare a logical data value read from the first dual-port memory cell subsequent to the write operation with a known logical data value previously written to the first dual-port memory cell during the write operation.

10. The memory device of claim 8, wherein, in performing the write operation, the read/write logic is to pre-charge a bit-line connected to the first dual-port memory cell via the first port, and assert a word-line connected to the first dual-port memory cell via the first port.

11. The memory device of claim 8, wherein the memory testing logic comprises:
a command scan register to receive one or more serially issued commands from a built-in self-test processor, each command including a data portion, a memory address, and a memory test command.

12. The memory device of claim 11, wherein the memory testing logic further comprises:
a data generator to generate data signals during a memory test involving a memory write operation, the data signals generated based on the data portion of a command received from the built-in self-test processor;
an address generator to generate a second memory address during a memory test operation, the memory address generated based on the memory address included as part of the command received from the built-in self-test processor and corresponding to the location of the dual-port memory cell to be tested; and
a memory test command generator to decode the memory test command included as part of the command received from the built-in self-test processor, and to generate control signals for performing the memory test operation.

13. A machine-readable medium storing data that represents the dual-port memory device of claim 8.

14. The machine-readable medium storing a memory compiler to provide a design for one or more lithographic masks used in fabricating a dual-port memory device, comprising:
an array of dual-port memory cells;
read/write logic to read from and write to the array of dual-port memory cells; and
memory testing logic to cause the read/write logic to perform a write operation at a first port of a first dual-port memory cell while the first dual-port memory cell is in a stressed condition, the write operation occurring at a frequency substantially equivalent to a maximum operating frequency of the dual-port memory device, and the stressed condition caused by emulating a read operation at a second port of the first dual-port memory cell during the write operation.

15. A method for testing a dual-port memory cell having a first port and a second port, comprising:
performing a write operation to write a known logical data value to the dual-port memory cell;
performing a read operation to read a logical data value from the first port of the dual-port memory cell, while emulating a write operation on the second port of the dual-port memory cell; and
comparing the logical data value read from the first port of the dual-port memory cell with the known logical data value initially written to the dual-port memory cell to determine whether an error occurred during the read operation, wherein the read operation and write operation occur at a clock frequency substantially equivalent to a maximum operating frequency of the dual-port memory device, wherein emulating the write operation on the second port of the dual-port memory cell includes asserting a word-line connected to the dual-port memory cell via the second port while disabling write driver logic so as to prevent writing a logical data value to the dual-port memory cell via the second port.

16. The method of claim 15, further comprising:
prior to performing the write operation to write the known logical data value to the dual-port memory cell, receiving a first command at a command scan register, the command including (i) a memory testing command directing the read/write logic to write the known logical data value to the dual-port memory cell, (ii) the known logical data value to be written to the dual-port memory cell, and (iii) the memory address of the dual-port memory cell to be written; and
subsequent to the write operation, but prior to the read operation, receiving a second command at the command scan register, the second command including (i) a memory testing command directing the read/write logic to read a logical data value from the first port of the dual-port memory cell while emulating a write operation on the second port of the dual-port memory cell, and (ii) the memory address of the dual-port memory cell to be read.

17. A machine-readable medium storing data that represents a memory device with memory testing logic to perform the method of claim 15.

18. A method for testing a dual-port memory cell having a first port and a second port, comprising:
performing a write operation to write a known logical data value to the first port of the dual-port memory cell, while emulating a read operation on the second port of the dual-port memory cell;
performing a read operation to read a logical data value from the dual-port memory cell;
comparing the logical data value read from the dual-port memory cell with the known logical data value initially written to the dual-port memory cell via the first port to determine whether an error occurred during the write operation, wherein the read operation and write operation occur at a clock frequency substantially equivalent to a maximum operating frequency of the dual-port memory device; and
prior to performing the write operation to write the known logical data value to the dual-port memory cell, receiving a first command at a command scan register, the command including (i) a memory testing command directing the read/write logic to write the known logical data value to the dual-port memory cell while emulating the read operation on the second port of the dual-port memory cell, (ii) the known logical data value to be written to the dual-port memory cell, and (iii) the memory address of the dual-port memory cell to be written; and subsequent to the write operation, but prior to the read operation, receiving a second command at the command scan register, the second command including (i) a memory testing command directing the read/write logic to read a logical data value from the first port of the dual-port memory cell while emulating the write operation on the second port of the dual-port memory cell, and (ii) and the memory address of the dual-port memory cell to be read.

19. The method of claim 18, wherein emulating the read operation on the second port of the dual-port memory cell includes asserting a word-line connected to the dual-port memory cell via the second port while disabling a sense amplifier so as to prevent reading a logical data value from the dual-port memory cell via the second port.

20. A machine-readable medium storing data that represents a memory device with memory testing logic to perform the method of claim 18.

21. An apparatus, comprising:
a bus;
processor logic;
a multi-port memory device having an array of multi-port memory cells, each multi-port memory cell connected to one word-line and two bit-lines per port; and
memory testing logic to perform a first memory access operation at a first port of a first multi-port memory cell while the first multi-port memory cell is in a stressed condition, the memory access operation occurring at a frequency substantially equivalent to a maximum operating frequency of the multi-port memory device, and the stressed condition caused by emulating a second memory access operation at a second port of the first multi-port memory cell during the first memory access operation, wherein the first memory access operation is a read operation, and the second memory access operation is a write operation, the write operation emulated at the second port by asserting a word-line associated with the second port while disabling write driver logic so as to prevent writing a logical data value to the first multi-port memory cell.

22. An apparatus comprising:
a bus;
processor logic;
a multi-port memory device having an array of multi-port memory cells, each multi-port memory cell connected to one word-line and two bit-lines per port; and
memory testing logic to perform a first memory access operation at a first port of a first multi-port memory cell while the first multi-port memory cell is in a stressed condition, the memory access operation occurring at a frequency substantially equivalent to a maximum operating frequency of the multi-port memory device, and the stressed condition caused by emulating a second memory access operation at a second port of the first multi-port memory cell during the first memory access operation, wherein the first memory access operation is a write operation, and the second memory access operation is a read operation, the read operation emulated at the second port by asserting a word-line associated with the second port while disabling a sense amplifier so as to prevent reading a logical data value from the multi-port memory cell via the second port.

23. A machine-readable medium storing data that represents the apparatus of claim 21.

24. The machine-readable medium of claim 23 storing a memory compiler to provide a design for one or more lithographic masks used in fabricating the apparatus of claim 23.

25. A machine-readable medium storing instructions, which when executed by a machine, cause the machine to perform the method of claim 18.

* * * * *